United States Patent [19]
Kim

[11] Patent Number: 6,121,906
[45] Date of Patent: Sep. 19, 2000

[54] SERIAL/PARALLEL SELECTIVE CONVERTER

[75] Inventor: Si-Hyeon Kim, Gumi, Rep. of Korea

[73] Assignee: Hyundai Electronics Industries Co., Ltd., Ichon-shi, Rep. of Korea

[21] Appl. No.: 09/145,301

[22] Filed: Sep. 2, 1998

[30] Foreign Application Priority Data

Nov. 6, 1997 [KR] Rep. of Korea .................. 97-58508

[51] Int. Cl.[7] .................................................. H03M 9/00
[52] U.S. Cl. ............................................ 341/100; 341/101
[58] Field of Search ..................................... 341/100, 101

[56] References Cited

U.S. PATENT DOCUMENTS 4,775,990 10/1988 Kamuro et al. ..................... 377/77
5,055,842 10/1991 Mueller ............................. 341/100
5,982,309 11/1999 Xi et al. ............................ 341/101

*Primary Examiner*—Trong Phan
*Attorney, Agent, or Firm*—Fleshner & Kim, LLP

[57] ABSTRACT

A serial/parallel selective converter is provided that selectively receives and outputs data by using a plurality of serial input/output switching latches and a plurality of parallel input/output switching latches. The serial/parallel selective converter can further include three sets of transmission gates respectively coupling the plurality of serial input/output switching latches and the plurality of parallel input/output switching latches. The serial/parallel selective converter can output a serial input data signal as a parallel data signal and can also output a parallel input data signal as a serial data signal based on a serial/parallel selection control signal.

20 Claims, 7 Drawing Sheets

FIG. 2A BACKGROUND ART SCLK 
FIG. 2B BACKGROUND ART PCLK 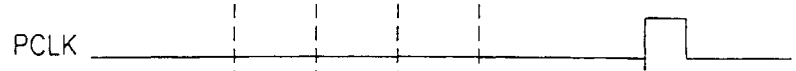
FIG. 2C BACKGROUND ART ID 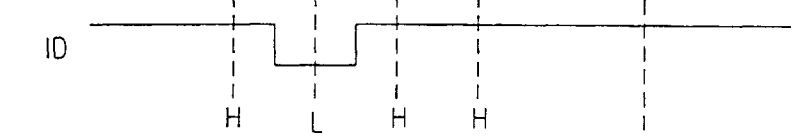
FIG. 2D BACKGROUND ART OD0 
FIG. 2E BACKGROUND ART OD1 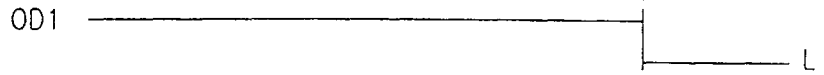
FIG. 2F BACKGROUND ART OD2 
FIG. 2G BACKGROUND ART OD3 
FIG. 2H BACKGROUND ART SB 

FIG. 4A  CK1 
FIG. 4B  CK2 
FIG. 4C  DINOUT 
FIG. 4D  INOUT0 
FIG. 4E  INOUT1 
FIG. 4F  INOUT2 
FIG. 4G  INOUT3 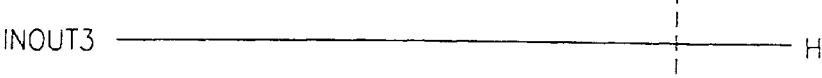
FIG. 4H  SB 
FIG. 4I  CTRL 
FIG. 4J  PS-CTRL 

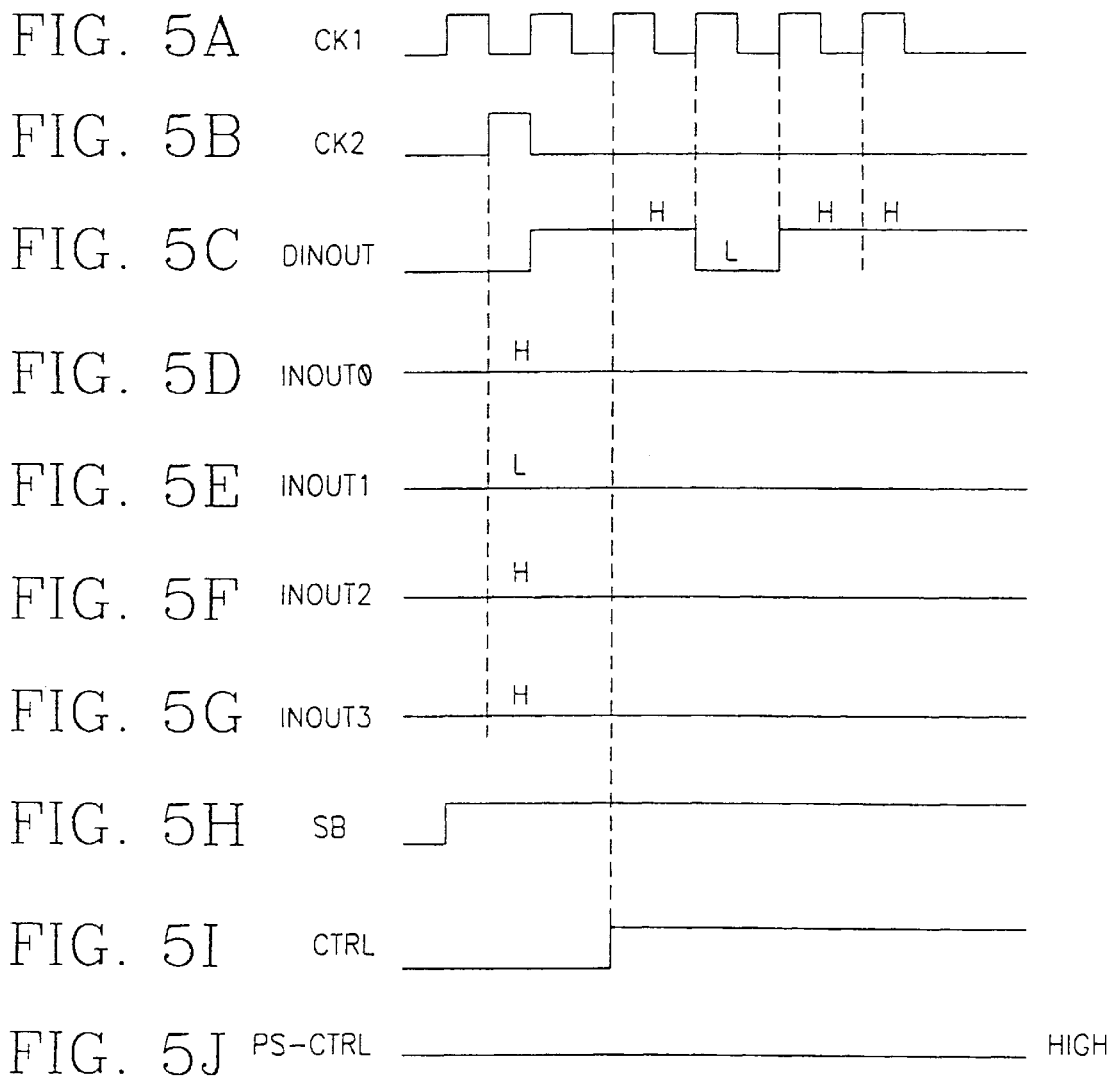

SERIAL/PARALLEL SELECTIVE CONVERTER

BACKGROUND OF THE INVENTION

1. Field of the Invention

The present invention relates to a converter, and in particular, to a converter that converts serial data to parallel data and parallel data to serial data.

2. Background of the Related Art

As shown in FIG. 1, a related art serial to parallel converter includes serial transmitting latches STL1–STL4 that are synchronized by receiving a serial clock signal SCLK. Parallel transmitting latches PTL1–PTL4 are initialized and synchronized by receiving a initialization signal SB and a parallel clock signal PCLK, respectively.

The operation of the related art serial to parallel converter will now be described assuming a 4 bit input data signal ID. As shown in FIG. 2C, the input data signal is serially input to a first serial transmitting latch STL1 at every rising edge of the serial clock signal SCLK, which is shown in FIG. 2A. A data signal output from the serial transmitting latch STL1 is inputted to a second serial transmitting latch STL2 at a next rising edge of the serial clock signal SCLK. The above process is repeatedly performed to transmit the input data signal ID (e.g., the 4 bit input data) to each of the serial transmitting latches STL1–STL4. That is, the input data signal ID of 4 bits is received by each of the serial transmitting latches STL1–STL4 after 4 rising edges of the serial clock signal SCLK.

Each of the parallel transmitting latches PTL1–PTL4 respectively receives the serial input data signal ID, which was received by each of the serial transmitting latches STL1–STL4, and outputs in parallel output data OD0–OD3 as shown in FIGS. 2D to 2G at a rising edge of the parallel clock signal PCLK. The parallel clock signal is shown in FIG. 2B.

An initial output value of cells of each of the parallel transmitting latches PTL1–PTL4 is maintained at a high level in accordance with the initialization signal SB as shown in FIG. 2H. The parallel transmitting latches PTL1–PTL4 output the serial input data signal ID at a normal state as the parallel output data OD0–OD3 after the rising edge of the parallel clock signal PCLK.

However, the related art serial to parallel converter has various disadvantages. The related art converter converts the serial input data to the parallel data, but is not able to convert the parallel data to the serial data.

SUMMARY OF THE INVENTION

An object of the prevent invention is to provide a converter that solves at least the above-described problems in the related art.

Another object of the present invention is to provide a converter that converts a serial data signal to a parallel data signal and converts a parallel data signal to a serial data signal.

A further object of the present invention is to provide a serial/parallel converter that selectively converts serial data to parallel data or parallel data to serial data based on a selection signal.

To achieve the above objects in a whole or in a part, there is provided a converter according to the present invention that includes a plurality of serial input/output switching latches that receive/output a serial data signal; a plurality of parallel input/output switching latches that receive/output a parallel data signal after being initialized by an initialization signal; a first logic circuit that receives a control signal and a serial/parallel selection control signal; a second logic circuit that inverts a signal output by the first logic circuit; a first plurality of transmitting gates, which are controlled by signals respectively output by the first and second logic circuits, that respectively transmit an output or input signal between each terminal D of the parallel input/output switching latches and of each terminal Q of the serial input/output switching latches; a third logic circuit that inverts the serial/parallel selection control signal; and a second plurality of transmitting gates, which are controlled by the serial/parallel selection control signal and an output signal of the third logic circuit, that respectively transmit an input or output of a terminal Q of a predetermined serial input/output switching latch of the plurality of serial input/output switching latches between a terminal D of an adjacent serial input/output switching latch.

To further achieve the above objects in whole or in part, there is provided a bidirectional converter according to the present invention that includes a first unit that has two modes of operation (a) and (b), wherein in mode (a) the first unit receives serial data and outputs parallel data, and in mode (b) the first unit receives serial data and outputs serial data; a second unit that has two modes of operation (a) and (b), wherein the second unit in the mode (a) receives parallel data and outputs parallel data and in mode (b) the second unit receives parallel data and outputs serial data; and a mode control unit that controls the first and second units to operate in one of the modes (a) and (b).

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 2A to 2H are diagrams showing timing waveforms of the converter in FIG. 1;

FIGS. 4A to 4J are diagrams showing timing waveforms of the circuit of FIG. 3 when an input serial data signal is outputted as a parallel data signal;

FIGS. 5A to 5J are diagrams showing timing waveforms of the circuit FIG. 3 when an input parallel data signal is output as a serial data signal;

DETAILED DESCRIPTION OF PREFERRED EMBODIMENTS

Figure 1:
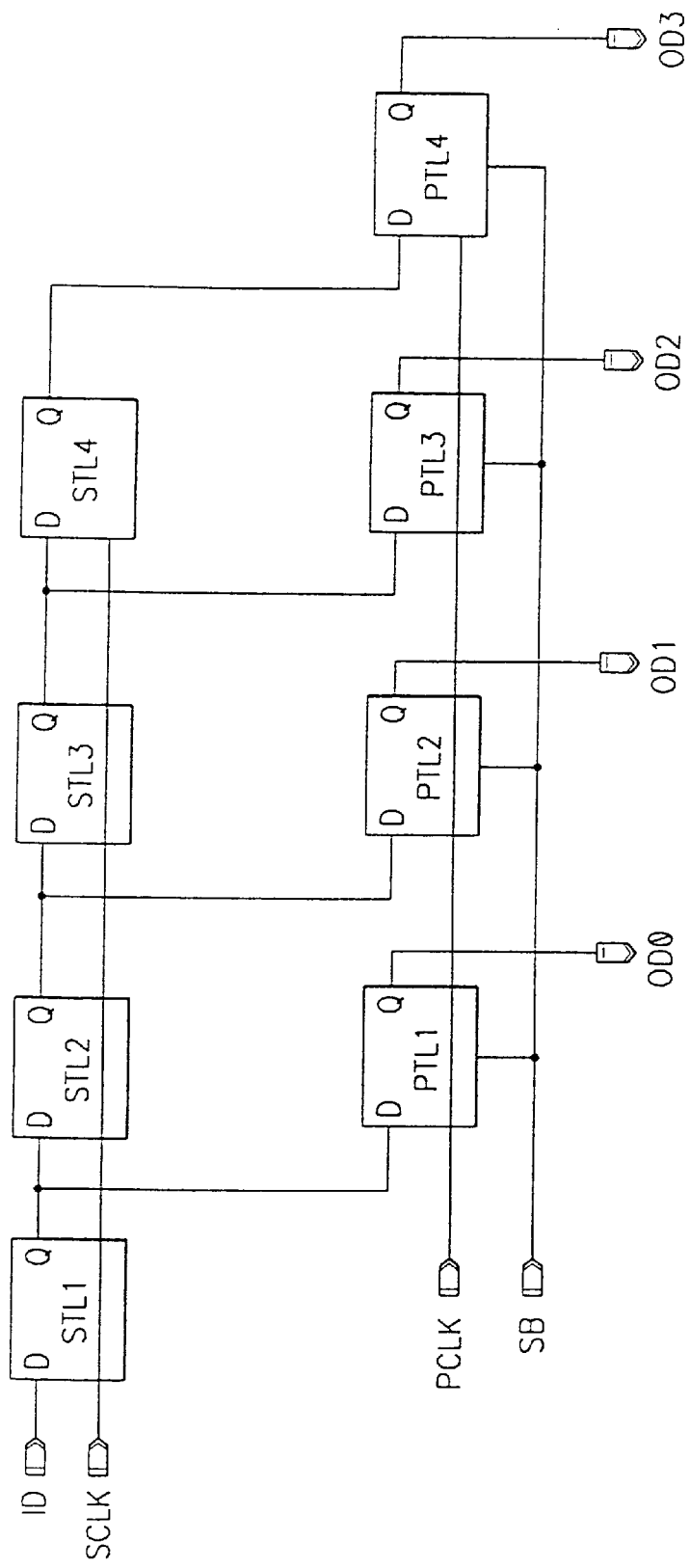
FIG. 1 is a block diagram showing a related art serial to parallel converter.
Figure 3:
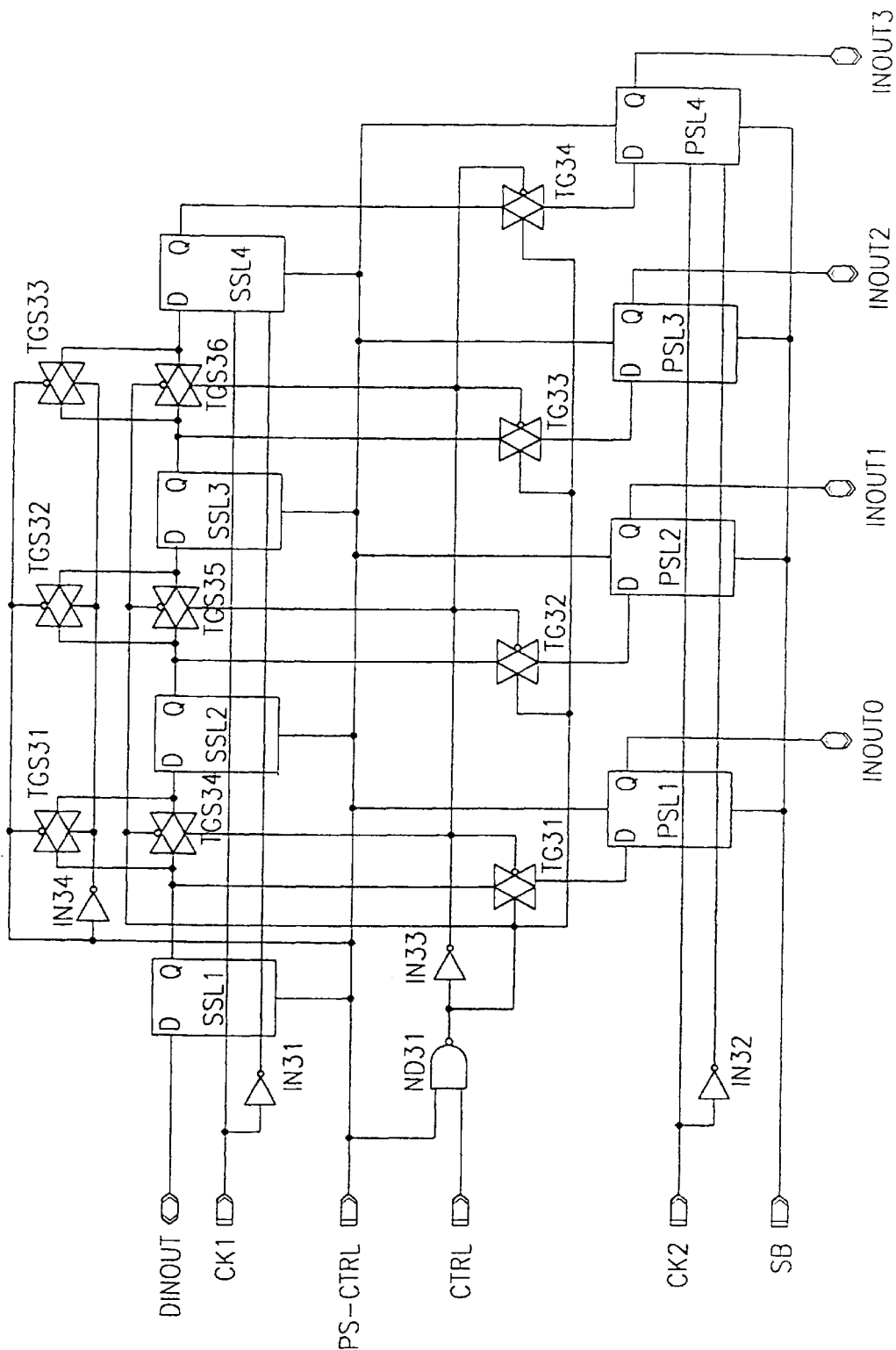
FIG. 3 is a block diagram showing a preferred embodiment of a converter according to the present invention.
Figure 6:
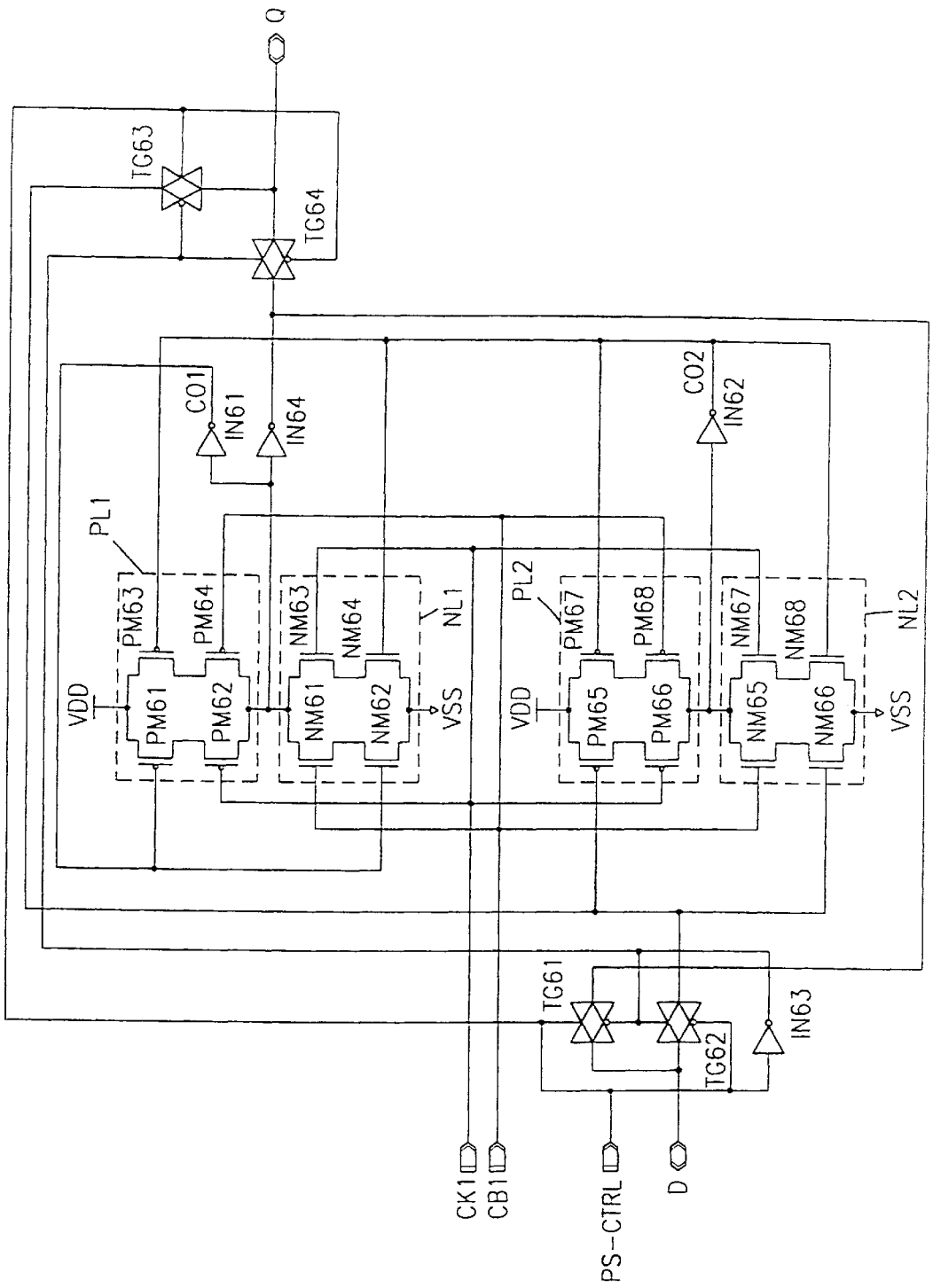
FIG. 6 is a circuit diagram showing a preferred embodiment of a serial input/output switching latch cell according to the present invention.
Figure 7:
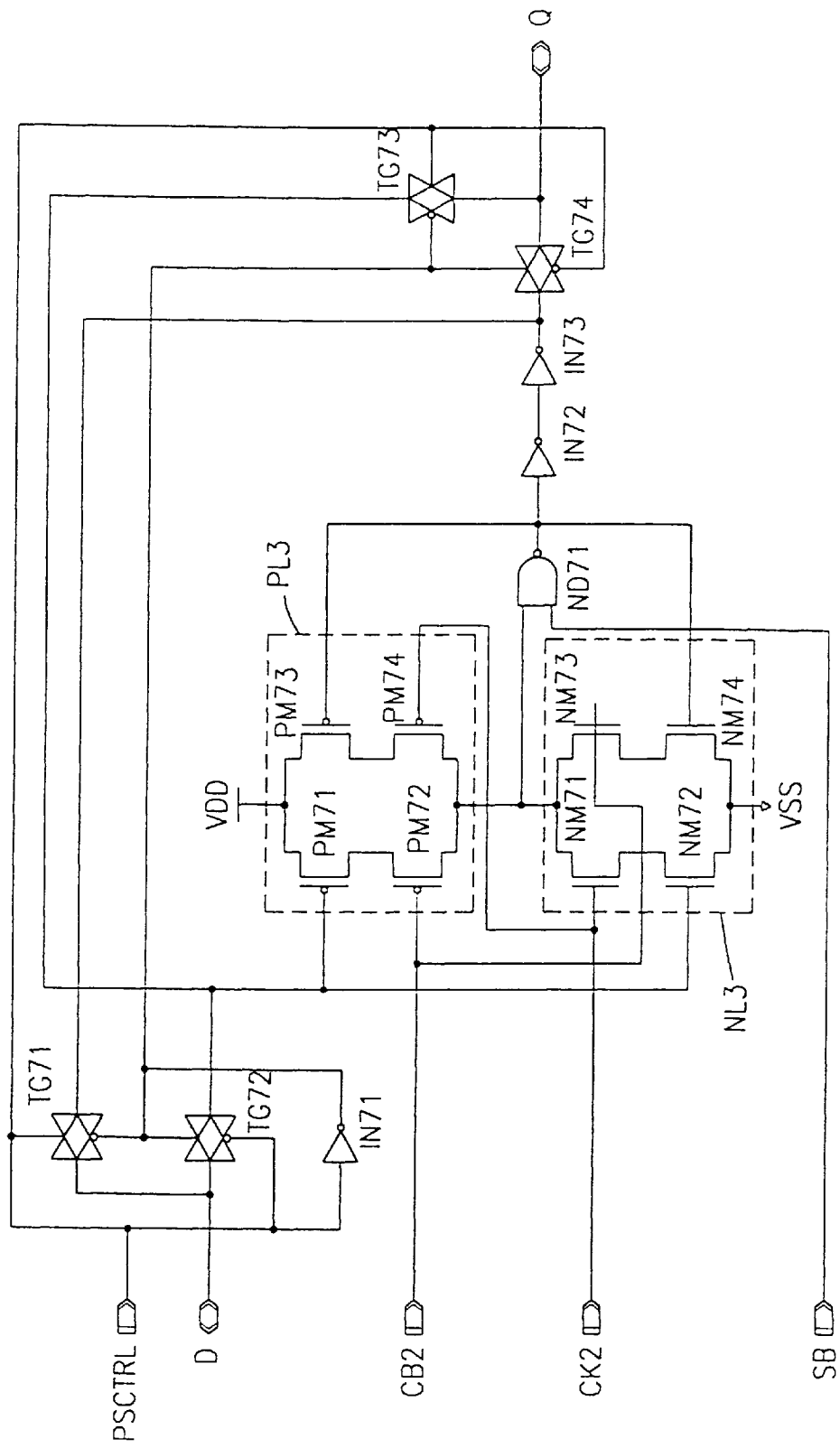
FIG. 7 is a circuit diagram showing a preferred embodiment of a parallel input/output switching latch cell according to the present invention.

As shown in FIG. 3, a first preferred embodiment according to the present invention is a serial/parallel selective converter that includes an inverter IN31 for inverting a first external clock signal CK1 and a plurality of serial input/output switching latches SSL1–SSL4, which are synchronized by the first external clock signal CK1 and an inverted signal CB1 thereof. The inverted signal CB1 is shown in FIG. 6. The plurality of serial input/output switching latches SSL1–SSL4 are for receiving (i.e., inputting) or outputting a serial data signal in accordance with a serial/parallel selection control signal PSCtrl. An inverter IN32 inverts a second external clock signal CK2. A plurality of parallel input/output switching latches PSL1–PSL4 are initialized by a reset signal SB and synchronized by the second external clock signal CK2 and an inverted signal CB2 thereof. The inverted signal CB2 is shown in FIG. 7. The plurality of parallel input/output switching latches PSL1–PSL4 are for receiving (i.e., inputting or outputting a parallel data signal in accordance with the serial/parallel selection control signal PSCtrl. A NAND gate ND31 receives a control signal Ctrl and the serial/parallel selection control signal PSCtrl and an inverter IN33 inverts an output signal from the NAND gate ND31. A plurality of transmitting gates TG31–TG34 are each controlled by the output signal of the NAND gate ND31 and an inverted signal thereof. Each of the plurality of transmitting gates TG31–TG34 are coupled between a terminal D of each of the parallel input/output switching latches PSL1–PSL4 and a terminal Q of each of the serial input/output switching latches SSL1–SSL4, to transmit data signals. An inverter IN34 inverts the serial/parallel selection control signal PSCtrl. A plurality of transmitting gates TGS31–TGS33 are each controlled by the serial/parallel selection control signal PSCtrl and the inverted signal thereof. Each of the plurality of transmitting gates TGS31–TGS33 are coupled between the terminal Q of each serial input/output switching latch SSL and a terminal D of a following serial input/output switching latch SSL.

Each of the serial input/output switching latches SSL1–SSL4 and parallel input/output switching latches PSL1–PSL4 is a bidirectional latch cell. The serial/parallel selection control signal PSCtrl switches an input/output function of the bidirectional latch cell.

As shown in FIG. 6, a second preferred embodiment according to the present invention is a serial input/output switching latch. The second preferred embodiment, for example, can be used for each of the serial input/output switching latches SSL1–SSL4. Accordingly, the serial input/output switching latches of the second preferred embodiment includes a first PMOS transistor latch unit PL1 and a first NMOS transistor latch unit NL1 that are coupled in series between a supply voltage VDD and a ground voltage VSS. An inverter IN61 is commonly coupled with the first PMOS transistor latch unit PL1 and first NMOS transistor latch unit NL1 and outputs a first switching signal CO1. A second PMOS transistor latch unit PL2 and a second NMOS transistor latch unit NL2 are coupled in series between the supply voltage VDD and ground voltage Vss. An inverter IN62 is commonly coupled with the second PMOS transistor latch unit PL2 and the second NMOS transistor latch unit NL2 and outputs a second switching signal CO2.

An inverter IN63 inverts the serial/parallel selection control signal PSCtrl. A plurality of transmitting gates TG61–TG64 are each controlled by the serial/parallel selection control signal PSCtrl and an inverted signal thereof, and each are coupled between the terminals D and Q to transmit data. An inverter IN64 is commonly coupled with the first PMOS transistor latch unit PL1 and first NMOS transistor latch unit NL1 and outputs a signal to the transmitting gate TG64.

The first PMOS transistor latch unit PL1 includes a pair of PMOS transistors PM61, PM62 coupled in series between the supply voltage VDD and first NMOS transistor latch unit NL1 with gates that receive the first switching signal CO1 and the first external clock signal CK1, and a pair of PMOS transistors PM63, PM64 coupled in series between the supply voltage VDD and first NMOS transistor latch unit NL1 with gates that respectively receive the second switching signal CO2 and the inverted signal CB1 of the first external clock signal CK1. Sources of the PMOS transistors PM61, PM63 are commonly coupled and drains of the PMOS transistors PM62, PM64 are commonly coupled.

The second PMOS transistor latch unit PL2 includes a pair of PMOS transistors PM65, PM66 coupled in series between the supply voltage VDD and second NMOS transistor latch unit NL2 with gates that respectively receive a signal outputted from the terminal D via the transmitting gate TG62 and the first external clock signal CK1, and a pair of PMOS transistors PM67, PM68 coupled in series between the supply voltage VDD and second NMOS transistor latch unit NL2 with gates that receive the second switching signal CO2 and the inverted signal CB1 of the first external clock signal CK1. Sources of the PMOS transistors PM65, PM67 are commonly coupled, and drains of the PMOS transistors PM66, PM68 are commonly coupled.

The first NMOS transistor latch unit NL1 includes a pair of NMOS transistors NM61, NM62 are coupled in series between the first PMOS transistor latch unit PLI and ground voltage VSS with gates that respectively receive the inverted signal CB1 of the first external clock signal CK1 and the first switching signal CO1. A pair of NMOS transistors NM63, NM64 are coupled in series between the first PMOS transistor latch unit PLi and ground voltage VSS with gates that respectively receive the first external clock signal CK1 and the second switching signal CO2. Drains of the NMOS transistors NM61, NM63 are commonly coupled and sources of the NMOS transistors NM62, NM64 are commonly coupled.

The second NMOS transistor latch unit NL2 includes a pair of NMOS transistors NM65, NM66 coupled in series between the second PMOS transistor latch unit PL2 and the ground voltage VSS with gates that respectively receive the inverted signal CB1 of the first external clock signal CK1 and a signal outputted from the terminal D via the transmitting gate TG62. A pair of NMOS transistors NM67, NM68 are coupled in series between the second PMOS transistor latch unit PL2 and ground voltage VSS with gates that respectively receive the first external clock signal CK1 and the second switching signal CO2. Drains of the NMOS transistors NM65, NM67 are commonly coupled and sources of the NMOS transistors NM66, NM68 are commonly coupled.

As shown in FIG. 7, a third preferred embodiment of the present invention is a parallel input/output switching latch. The third preferred embodiment, for example, can be used for the parallel input/output switching latches PSL1–PSL4. Accordingly, the parallel input/output switching latch of the third preferred embodiment includes third PMOS and NMOS transistor latch units PL3, NL3 coupled in series between the supply voltage VDD and the ground voltage VSS and an inverter IN71 for inverting the serial/parallel selection control signal PSCtrl. A plurality of transmitting gates TG71–TG74 are controlled by the serial/parallel selection control signal PSCtrl and an inverted signal thereof and are coupled between the terminals D and Q. A NAND gate ND71 has a first input terminal commonly coupled with the third PMOS and NMOS transistor latch units PL3, NL3 and a second input terminal that receives the reset signal SB. Inverters IN72, IN73 sequentially invert a signal outputted from the NAND gate ND71. The output signal of the inverter IN73 is transmitted to the transmitting gate TG74.

The third PMOS transistor latch unit PL3 includes a pair of PMOS transistors PM71, PM72 coupled in series between the supply voltage VDD and the third NMOS transistor latch unit NL3 with gates that respectively receive a signal outputted from the terminal D via the transmitting gate TG72 and the inverted signal CB2 of the second external clock signal CK2. A pair of PMOS transistors PM73, PM74 are coupled in series between the supply voltage VDD and third NMOS transistor latch unit NL3 with gates that respectively receive an output from the NAND gate ND71 and the second external clock signal CK2. Sources of the PMOS transistors PM71, PM73 are commonly coupled and drains of the PMOS transistors PM72, PM74 are commonly coupled.

The third NMOS transistor latch unit NL3 includes a pair of NMOS transistors NM71, NM72 coupled in series between the third PMOS transistor latch unit PL3 and ground voltage VSS with gates that respectively receive the second external clock signal CK2 and a signal outputted from the terminal D via the transmitting gate TG72. A pair of NMOS transistors NM73, NM74 are coupled in series between the third PMOS transistor latch unit PL3 and ground voltage VSS with gates that respectively receive the inverted signal CB2 of the second external clock signal CK2 and an output from the NAND gate ND71. Drains of the NMOS transistors NM71, NM73 are commonly coupled and sources of the NMOS transistors NM72, NM74 are commonly coupled.

Operations of the first preferred embodiment of the serial/parallel selective converter according to the present invention will now be described. When the serial/parallel selection control signal PSCtrl is at a low level (e.g., when the signal PSCtrl is "0"), each terminal D of the serial input/output switching latches SSL1–SSL4 and parallel input/output switching latches PSL1–PSL4 becomes an input terminal, and each terminal Q becomes an output terminal. When the serial/parallel selection control signal PSCtrl is at a high level, (e.g., when the signal PSCtrl is "1"), each terminal D of the serial input/output switching latches SSL1–SSL4 and parallel input/output switching latches PSL1–PSL4 becomes an output terminal and each terminal Q becomes an input terminal.

As shown in FIGS. 4I and 4J, when each of the serial/parallel selection control signal PSCtrl and control signal Ctrl is at the low level, the terminal D and terminal Q of each of the serial input/output switching latches SSL1–SSL4 and parallel input/output switching latches PSL1–PSL4 become an input terminal and an output terminal, respectively. As shown FIG. 4A, the first serial input/output switching latch SSL1 can output a received data signal to the second serial input/output switching latch SSL2 at a rising edge of the first external clock signal CK1. This process can be repeatedly performed. When four bits of a serial data signal DINOUT as shown in FIG. 4C is input to the serial input/output switching latches SSL1–SSL4 using the first external clock signal CK1, the parallel input/output switching latches PSL1–PSL4, which are initially set as "1" based on the initialization signal SB as shown in FIG. 4H, respectively, output data signals latched in the serial input/output switching latches SSL1–SSL4 at a rising edge of the second external clock signal CK2 as parallel data signals INOUT0–INOUT3. The clock signal CK2 is shown in FIG. 4B and the parallel data signals INOUT0–INOUT3 are respectively shown in FIGS. 4D to 4G.

As shown in FIGS. 5I and 5J, when the serial/parallel selection control signal PSCtrl is at a high and the control signal is at a low level, each input terminal, that is the terminal Q, of a certain serial input/output switching latch SSL, is not affected by an output from an output terminal, that is the terminal D, of a following serial input/output switching latch SSL.

When the parallel data signals INOUT0–INOUT3 as shown in FIGS. 5D to 5G are inputted, each of the parallel input/output switching latches PSL1–PSL4 correspondingly transmit data signals to the serial input/output switching latches SSL1–SSL4 at a rising edge of the second external signal CK2 as shown in FIG. 5B. Then, when the control signal Ctrl becomes a high level, each input terminal Q, of the serial input/output switching latch SSL is connected to the output terminal, the terminal D of the following serial input/output switching latch SSL. Accordingly, the data signals INOUT0–INOUT3, which are inputted to the serial input/output switching latches SSL1–SSL4, are sequentially outputted as a serial data signal DINOUT at every rising edge of the first external clock signal CK1. The serial data signal DINOUT is shown in FIG. 5C.

Operations of the preferred embodiments are described assuming a "4-bit" input serial data id. However, the present invention is not intended to be so limited. For example, other bit-length input serial data ids could be used.

As described above, the preferred embodiment according to the present invention have various advantages. In particular, the first preferred embodiment of a serial/parallel selective converter can output an inputted serial data signal as a parallel data signal and also output an inputted parallel data signal as a serial data signal based on a serial/parallel selection control signal.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A serial/parallel converter, comprising:
   a plurality of serial input/output switching latches that both receive and output a serial data signal;
   a plurality of parallel input/output switching latches that both receive and output a parallel data signal;
   a first logic circuit that logically processes a control signal and a selection signal;
   a second logic circuit that logically processes an output signal of the first logic circuit;
   a first plurality of transmission gates controlled by output signals from the first and second logic circuits, wherein each of the first transmission gates respectively transmits both an output signal and an input signal between a first terminal of each of the parallel input/output switching latches and a second terminal of a corresponding one of the serial input/output switching latches; and
   second and third pluralities of transmission gates that transmit both the input signal and the output signal between the second terminal of one serial input/output switching latch and a first terminal of a corresponding serial input/output switching latch, wherein the second plurality of transmission gates is controlled by the output signals of the first and second logic circuits, and wherein the third plurality of transmission gates is controlled by the selection signal and an inverted selection signal.

2. The converter of claim 1, wherein each of the serial input/output switching latches comprises:
   a first transistor latch unit and a second transistor latch unit coupled in series between a first prescribed voltage and a second prescribed voltage;
   a first logic-gate commonly coupled with the first and second transistor latch units that outputs a first switching signal;
   a third transistor latch unit and a fourth transistor latch unit coupled in series between the first prescribed voltage and the second prescribed voltage;
   a second logic-gate commonly coupled with the third and fourth transistor latch units that outputs a second switching signal;
   first to fourth transmission gates, each controlled by the selection signal and the inverted selection signal and coupled between the first and second terminals to transmit data; and
   a fourth logic-gate commonly connected with the first and second transistor latch units that outputs a signal to the fourth transmission gate.

3. The converter of claim 2, wherein each of the first and third transistor latch units comprises:
   first and second transistors coupled in series between the first prescribed voltage and the second transistor latch unit, wherein a control electrode of the second transistor receives a first clock signal; and
   third and fourth transistors coupled in series between the first prescribed voltage and the second transistor latch unit having control electrodes that respectively receive the second switching signal and an inverted first clock signal, wherein first electrodes of the first and third transistors are commonly coupled and second electrodes of the second and fourth transistors are commonly coupled.

4. The converter of claim 3, wherein the first and third transistor latch units are PMOS transistor latch units, the second and fourth transistor latch units are NMOS transistor units, the first through fourth transistors are PMOS transistors, the first and second prescribed voltages are supply and ground voltages, the first, second and control electrodes are source, drain and gate electrodes, wherein a gate electrode of the first transistor of the first transistor latch unit receives the first switching signal and a gate electrode of the first transistor of the third transistor latch unit receives a signal from the first terminal through the second transmission gate, and wherein the first and second terminals are D and Q terminals, respectively.

5. The converter of claim 2, wherein the second transistor latch unit comprises:
   first and second transistors coupled in series between the first transistor latch unit and the second prescribed voltage having control electrodes that respectively receive an inverted first clock signal and the first switching signal; and
   third and fourth transistors coupled in series between the first transistor latch unit and the second prescribed voltage having control electrodes that respectively receive the first clock signal and the second switching signal, wherein second electrodes of the first and third transistors are commonly coupled and first electrodes of the second and fourth transistors are commonly coupled.

6. The converter of claim 2, wherein the fourth transistor latch unit comprises:
   first and second transistors coupled in series between the third transistor latch unit and the second prescribed voltage having control electrodes that respectively receive an inverted first clock signal and a signal from the first terminal using the second transmission gate; and
   third and fourth transistors coupled in series between the third transistor latch unit and the second prescribed voltage having control electrodes that respectively receive the first clock signal and the second switching signal, wherein second electrodes of the first and third transistors are commonly coupled and first electrodes of the second and fourth transistors are commonly coupled.

7. The converter of claim 2, wherein when the selection signal is a low level signal, the first and second terminals of the serial input/output switching latches are an input terminal and an output terminal, respectively, and when the selection signal is a high level signal, the first and second terminals of the serial input/output switching latches are the output terminal and the input terminal, respectively.

8. The converter of claim 1, wherein each of the parallel input/output switching latches comprises:
   a first transistor latch unit and a second transistor latch unit coupled in series between a first prescribed voltage and a second prescribed voltage;
   first to fourth transmission gates, controlled by the selection signal and the inverted selection signal, wherein the first and fourth transmission gates are coupled between the first and second terminals to transmit data; and
   a first logic-gate having a first input terminal, which is commonly coupled with the first transistor latch unit and the second transistor latch unit, and a second input terminal that receives a reset signal, wherein an output signal of the first logic-gate is transmitted to the fourth transmission gate.

9. The converter of claim 8, wherein the first transistor latch unit comprises:
   first and second transistors coupled in series between the first prescribed voltage and the second transistor latch unit having control electrodes that respectively receive a signal from the first terminal through the second transmission gate and an inverted second clock signal; and
   third and fourth transistors coupled in series between the first prescribed voltage and the second transistor latch unit having control electrodes that respectively receive the output signal of first logic-gate and the second clock signal, wherein first electrodes of the first and third transistors are commonly coupled and second electrodes of the second and fourth transistors are commonly coupled.

10. The converter of claim 8, wherein the second transistor latch unit comprises:
    first and second transistors coupled in series between the first transistor latch unit and the second prescribed voltage having control electrodes that respectively receive the second clock signal and a signal from the first terminal through the second transmission gate; and
    third and fourth transistors coupled in series between the first transistor latch unit and the second prescribed voltage having control electrodes that respectively receive the inverted second clock signal and the output signal of the first logic-gate, wherein second electrodes of the first and third transistors are commonly coupled and first electrodes of the second and fourth transistors are commonly coupled.

11. The converter of claim 8, further comprising second and third logic-gates that sequentially invert the output signal from the first logic-gate, wherein the first and second transmitter latch units are PMOS and NMOS transistor latch units, respectively.

12. The converter of claim 1, wherein the serial input/output switching latches and the parallel input/output switching latches are bidirectional latch cells, wherein an input/output function of the bidirectional latch cells is controlled by a latch control signal.

13. The converter of claim 1, further comprising a third logic circuit that inverts the selection signal, wherein the first logic circuit is a NAND-gate, and the second and third logic circuits are an inverter.

14. The converter of claim 1, wherein when the selection and control signals are a low level, first through penultimate serial input/output switching latches transmit to a succeeding serial input/output switching latch using the third plurality of transmission gates, and wherein when the selection and control signals are high level, second through last serial input/output switching latches transmit to a preceding serial input/output switching latch using the second plurality of transmission gates.

15. The converter of claim 1, wherein a first serial input/output switching latch of the plurality of serial input/output switching latches respectively receives and outputs the serial data signal using the first terminal and wherein the plurality of parallel input/output latches respectively receive and output the parallel data signal using the second terminal.

16. The converter of claim 1, wherein the parallel input/output switching latches receive and output the parallel data signal after being initialized by an initialization signal, and when the selection signal is a low level signal, each of the first and second terminals of the serial input/output switching latches and the parallel input/output switching latches respectively become an input terminal and an output terminal, and when the selection signal is a high level signal, said each of the first and second terminals of the serial and parallel input/output switching latches respectively become the output terminal and the input terminal.

17. A converter, comprising:
a plurality of serial switching latches that both receive serial first data and output serial converted second data;
a plurality of parallel switching latches that both receive parallel second data and output parallel converted first data;
a first logic circuit that receives a control signal and a selection signal and outputs first and second switching signals;
a first plurality of transmission gates controlled by the first and second switching signals from the first logic circuit, wherein each of the first transmission gates respectively couples a second terminal of one of the serial switching latches with one of a first terminal of each of the parallel switching latches to transmit both the serial first data signal and the parallel second data signal, and a first terminal of a corresponding serial switching latch of the plurality of serial switching latches to transmit the serial first data signal; and
a second plurality of transmission gates that transmit the serial converted second signal between the second terminal of the serial switching latches and a first terminal of the corresponding serial switching latch of the plurality of serial switching latches.

18. The converter of claim 17, wherein when the selection signal is a low level signal, each of the first and second terminals of the serial switching latches and the parallel switching latches respectively become an input terminal and an output terminal, and when the selection signal is a high level signal said each of the first and second terminals of the serial and parallel switching latches respectively become the output terminal and the input terminal.

19. A serial/parallel converter, comprising:
a plurality of first bidirectional latches that both receive and output a serial data signal, wherein the first bidirectional latches have first and second terminals;
a plurality of second bidirectional latches that both receive and output a parallel data signal, wherein the second bidirectional latches have first and second terminals;
a first logic circuit that logically processes a control signal and a selection signal;
a second logic circuit that logically processes an output signal of the first logic circuit;
a first plurality of transmitting gates controlled by output signals from the first and second logic circuits, wherein each of the first transmitting gates respectively transmits both an output signal and an input signal between a first terminal of each of the second bidirectional latches and a second terminal of a corresponding one of the first bidirectional latches; and
second and third pluralities of transmitting gates that transmit both the input signal and the output signal between the second terminal of one first bidirectional latch and a first terminal of a corresponding first bidirectional latch of the plurality of first bidirectional latches, wherein the second plurality of transmitting gates is controlled by the output signals of the first and second logic circuits, and wherein the third plurality of transmitting gates is controlled by the selection signal and an inverted selection signal.

20. The converter of claim 19, wherein when the selection and control signals are a low level, first through penultimate first bidirectional latches transmit to a succeeding first bidirectional latch using the third plurality of transmitting gates, and wherein when the selection and control signals are high level, second through last first bidirectional latches transmit to a preceding first bidirectional latch using the second plurality of transmitting gates.

* * * * *